(12) United States Patent
Nadeau-Dostie

(10) Patent No.: US 6,487,688 B1
(45) Date of Patent: Nov. 26, 2002

(54) METHOD FOR TESTING CIRCUITS WITH TRI-STATE DRIVERS AND CIRCUIT FOR USE THEREWITH

(75) Inventor: Benoit Nadeau-Dostie, Aylmer (CA)

(73) Assignee: Logicvision, Inc., San Jose, CA (US)

( * ) Notice: Subject to any disclaimer, the term of this patent is extended or adjusted under 35 U.S.C. 154(b) by 0 days.

(21) Appl. No.: 09/472,386

(22) Filed: Dec. 23, 1999

(51) Int. Cl.[7] .............................................. G01R 31/28
(52) U.S. Cl. ...................................... 714/726; 714/727
(58) Field of Search ...................... 379/106.06; 714/222, 714/726, 724, 727, 729, 730, 743

(56) References Cited

U.S. PATENT DOCUMENTS

| 4,455,453 A | * | 6/1984 | Parasekvakos et al. | 379/106.06 |
| 4,845,659 A | * | 7/1989 | Hrusecky | 71/222 |
| 4,947,357 A | * | 8/1990 | Stewart et al. | 714/726 |
| 5,136,185 A | | 8/1992 | Fleming et al. | 307/443 |
| 5,285,119 A | | 2/1994 | Takahashi | 307/473 |
| 5,404,359 A | | 4/1995 | Gillenwater et al. | 371/22.5 |
| 5,513,190 A | | 4/1996 | Johnson et al. | 371/22.5 |
| 5,528,601 A | | 6/1996 | Schmookler | 371/22.3 |
| 5,648,733 A | | 7/1997 | Worrell et al. | 326/86 |
| 6,029,263 A | * | 2/2000 | Gibson | 714/726 |

FOREIGN PATENT DOCUMENTS

| EP | 0 454 052 A2 | 10/1991 | G06F/11/26 |
| JP | 05240917 | 9/1993 | G01R/31/28 |
| JP | 07073067 | 3/1995 | G06F/11/22 |
| JP | 11094914 | 9/1999 | G01R/31/28 |

* cited by examiner

Primary Examiner—David Ton
(74) Attorney, Agent, or Firm—Sheridan Ross P.C.

(57) ABSTRACT

A scan-testing method for circuits having tri-state bus drivers disables all drivers during scan intervals and enables at most one of the bus drivers during the capture interval. A driver select signal is generated for each bus driver and gated with a corresponding circuit functional enable signal to generate a driver enable signal. A driver is selected by loading a driver select code into memory elements during the scan-in sequence and decoding the driver select code to produce the driver select signals.

Figure 1:
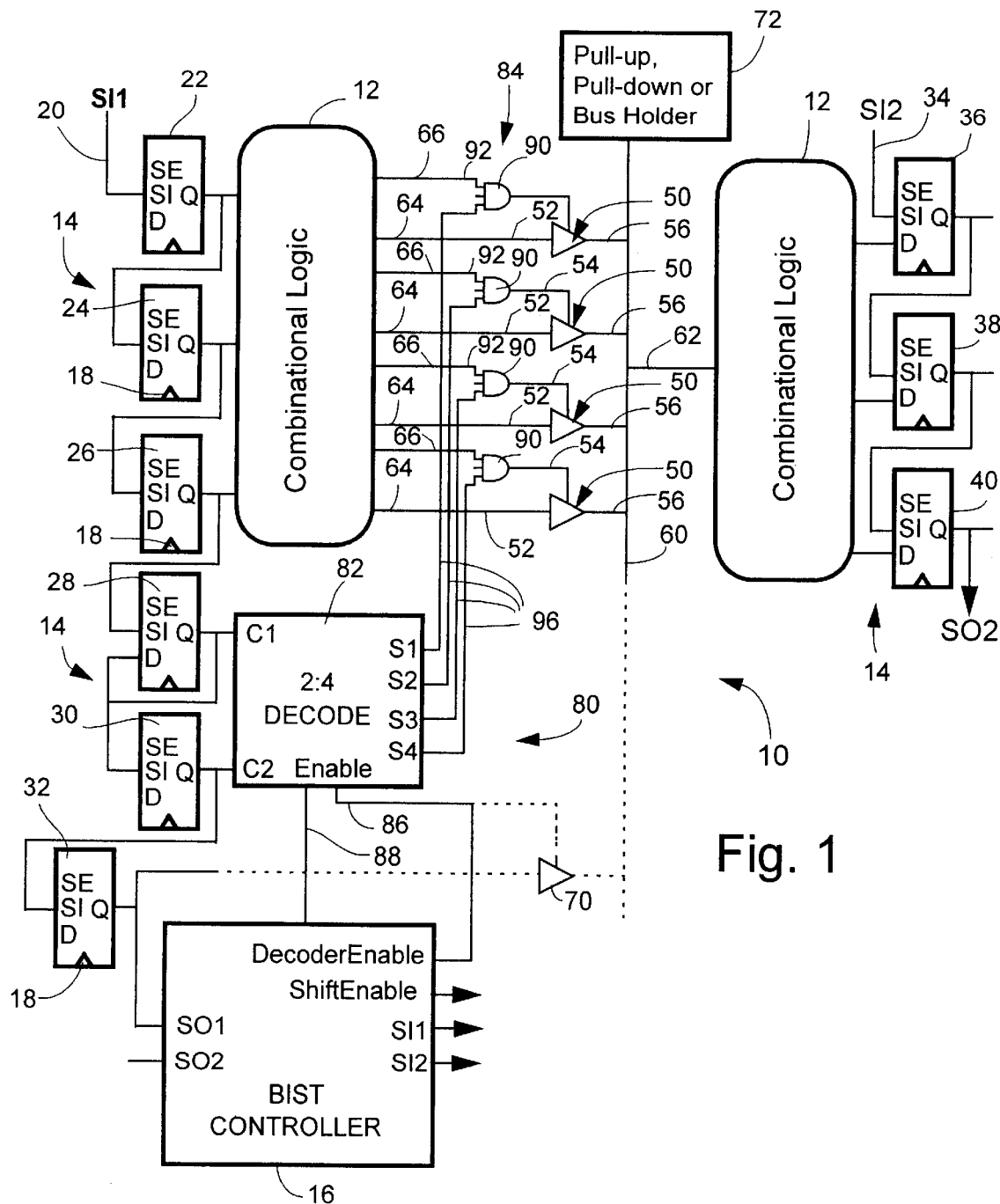

30 Claims, 4 Drawing Sheets

METHOD FOR TESTING CIRCUITS WITH TRI-STATE DRIVERS AND CIRCUIT FOR USE THEREWITH

The present invention generally relates to the testing of digital circuits and, more specifically, to the testing of integrated circuits having tri-state bus drivers and to driver control circuitry for use therewith.

BACKGROUND OF THE INVENTION

Testing of digital systems, such as the core logic of an integrated circuit, is typically performed by loading a test pattern or stimulus into scannable memory elements in the system, operating the system in normal mode for at least one clock cycle of the system clock, capturing the response of the system to the test stimulus, unloading the test response from the system and then comparing the responses obtained in the test to the responses which should have been obtained if the system was operating according to design. Problems arise when the circuit under test includes tri-state bus drivers. Tri-state drivers are used in digital circuits to connect data signals to a common bus under the control of an enable signal. For correct operation of the circuit, there must not be more than one driver enabled active at any given time. This is a requirement that is often not possible to meet in a self-test environment based in scan test methods because random test stimulus values are usually shifted in the scan chains and the circuit combinational logic driving the enable signals does not always guarantee that the enable signals are exclusive.

Various solutions to these problems have been proposed. U.S. Pat. No. 5,528,601 for "Scannable Latch for Multiplexor Control" is concerned with the situation where tri-state bus enable signals are all controlled from scannable elements. While scanning-in test vectors, the invention prevents bus contention by means of a combination of encoders/decoders. However, the proposal does not prevent bus contention during the capture cycle. This is a serious limitation of the proposal. During BIST, this might be fatal.

U.S. Pat. No. 5,513,190 for "Built-in Self-test Tri-state Architecture" is concerned with an arrangement for preventing bus contention. The serial connection of the INHIBIT signals provided limits the frequency of operation during BIST, a significant drawback of the method. Also, the probability of testing the last bus drivers near the end of the serial connection is much less than that of the drivers near the beginning, and thus, potentially leaves some of the faults untested.

U.S. Pat. No. 5,404,359 for "Fail-safe Fault Tolerant Circuit for Manufacturing Test Logic on Application Specific Integrated Circuits" provides a technique for avoiding contention on a bus during normal operation of the circuit due to a malfunction of test circuitry that could become active at an inopportune time. However, the patent does not disclose a method of testing the bus drivers described in the patent.

U.S. Pat. No. 5,136,185 for "Local Tristate Control Circuit" is similar to U.S. Pat. No. 5,513,190, mentioned above and, therefore, suffers from the same drawbacks. The patent provides-a serial connection from one bus driver to the, next indicating whether any of the bus drivers upstream is enabled. The patent differs from the latter in the manner in which the last bus driver is handled. If none of the upstream drivers is enabled, the last driver is forced to be enabled irrespective of the state of the functional enable signal output by the core logic. In this way, a pull-up or bus driver is not necessary to ensure the bus carries a value of 0 or 1. This method has the same disadvantages as the latter and, additionally, the impact of the timing of the enable signal of the last driver is more important than that of method proposed by others. The patent suggests that it is known to use a decoder to ensure that only one driver is enabled at any one time. However, testing the logic generating the bus driver enable signals in functional mode is not tested at all due to limitations of the method. Another disadvantage is that the method results in adding more delay along the path of the functional enable signals.

U.S. Pat. No. 5,285,119 for "Semiconductor Integrated Tri-state Circuitry with Test Means" discloses a method of modifying the tri-state circuit so that it behaves like a combinational network during test mode. This method has the disadvantage that some faults in the bus drivers are not tested and the test must be performed at lower speed.

SUMMARY OF THE INVENTION

The present invention seeks to overcome the difficulties outlined above by a method which involves disabling all drivers during scan intervals and enabling at most a selected one of the drivers during the capture interval by generating a driver select signal for each driver and gating the driver select signal with the circuit functional enable signal for each driver to generate a driver enable signal, the driver select signals being generated in such a manner that at most only the selected one of the drivers is active during the capture sequence. The selected one of the drivers is selected by loading a driver select code into memory elements during the scan-in sequence and decoding the driver select code to produce the driver select signals.

The method of the present invention takes advantage of the fact that a disabling mechanism is usually required for the tri-state drivers while scanning data into the memory elements. The invention provides a decoding circuit, dedicated to test, to implement the method. The decoding circuit operates to enable at most one driver at the end of the test stimulus loading sequence. A driver is only enabled if both its associated enable signal generated by the functional logic and the test-dedicated decoding logic driver select signal are active. The present invention supports various scan methodologies. In a clocked scan methodology, the scan sequence is performed at relatively low speed and the signals of the decoders have plenty of time to propagate to the different tri-state drivers, which may be distributed throughout the chip. The driver control circuit will enable only one driver, even if multiple functional enable signals carry an active value. This way, there is no bus contention and the test can be performed at-speed without adding delay compared to a methodology that uses deterministic patterns generated by an appropriate tool. In the proposed method, the functional circuitry does not need to be modified to implement the decoding in test mode and the insertion of the test circuitry into an integrated circuit can be automated.

One aspect of the present invention is generally defined as an improvement in a method of testing a circuit having two or more tri-state bus drivers, each having a data input, an enable input and a data output, the data outputs being connected together to form a bus, the circuit having core logic, a plurality of scannable memory elements, each having a clock input, an input connected to the output of the core logic and/or an output connected to an input to the core logic, and being configurable in scan mode in which the memory elements are connected to define one or more scan chains and in normal mode in which the memory elements are connected to the core logic in normal operational mode, the core logic generating a data input and a functional enable signal for each the tri-state bus drivers, the bus providing input to the core logic, the method including a shift-in sequence for clocking a test stimulus into the memory elements, a capture operation for capturing the response of the core logic to the test stimulus and a shift-out sequence for clocking captured responses out of the elements for analysis, the method comprising the improvement of:

storing a driver select code signal in scannable memory elements associated with the bus drivers, the driver select code signal identifying at most only one of the driver which is to be active during normal mode;

decoding the output of the associated scannable memory elements and generating a decoded driver select signal for each of the bus drivers;

gating each the decoded driver select signal with a functional driver enable signal for each the driver to generate a driver enable signal and applying the driver enable signal to the enable input of the driver;

disabling all of the drivers by generating an inactive driver select signal for each the bus drivers when the plurality of memory elements are configured in scan mode; and applying the driver enable signal to each the bus drivers when the plurality of memory elements are configured in normal mode.

Another aspect of the present invention is generally defined as a driver control circuit for use in an integrated circuit having core logic, two or more tri-state bus drivers, each having a data input, an enable input and a data output, the data outputs being connected together to form a bus, the circuit having core logic, a plurality of scannable memory elements, each having a clock input, an input connected to the output of the core logic and/or an output connected to an input to the core logic, and being configurable in scan mode in which the memory elements are connected to define one or more scan chains and in normal mode in which the memory elements are connected to the core logic in normal operational mode, the core logic generating a data input and a functional enable signal for each the tri-state bus drivers, the bus providing input to the core logic, the improvement comprising:

storage means associated with the bus drivers for storing a driver select code signal identifying at most only one of the drivers which is to be active during normal mode;

decoding means for decoding the driver select code signal and generating a decoded driver select signal for each of the bus drivers;

gating means for gating each decoded driver select signal with a functional driver enable signal for each driver and generating a driver enable signal and applying the driver enable signal to the enable input of the driver; and the decoding means being responsive to an active driver control signal for disabling all of the drivers by generating an inactive driver select signal for each the bus drivers when the plurality of memory elements are configured in scan mode and being responsive to an inactive driver control signal by applying the driver enable signal to each the bus drivers when the plurality of memory elements are configured in normal mode.

BRIEF DESCRIPTION OF THE INVENTION

Figure 2:
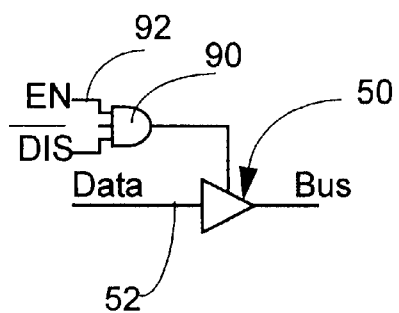
Figure 3:
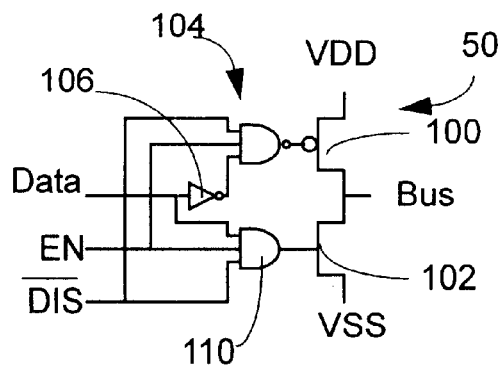
Figure 4:
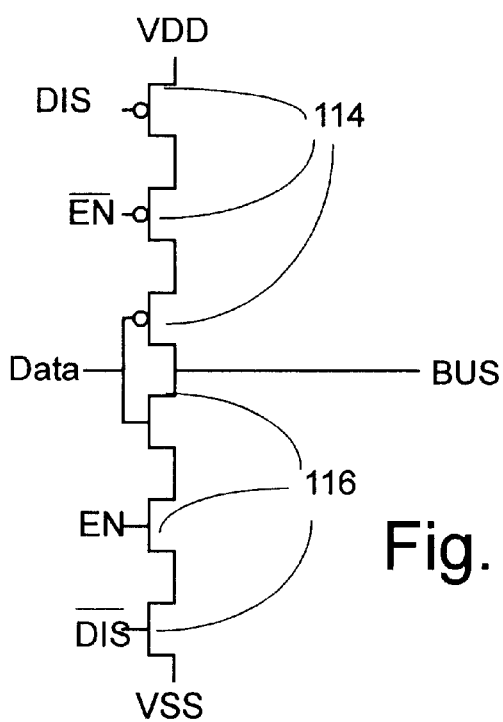
Figure 5:
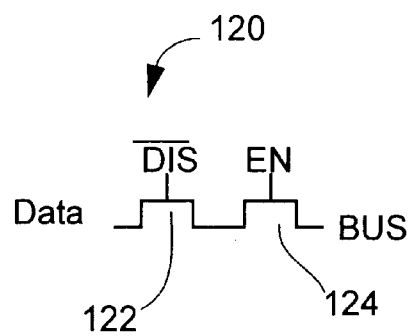
Figure 6:
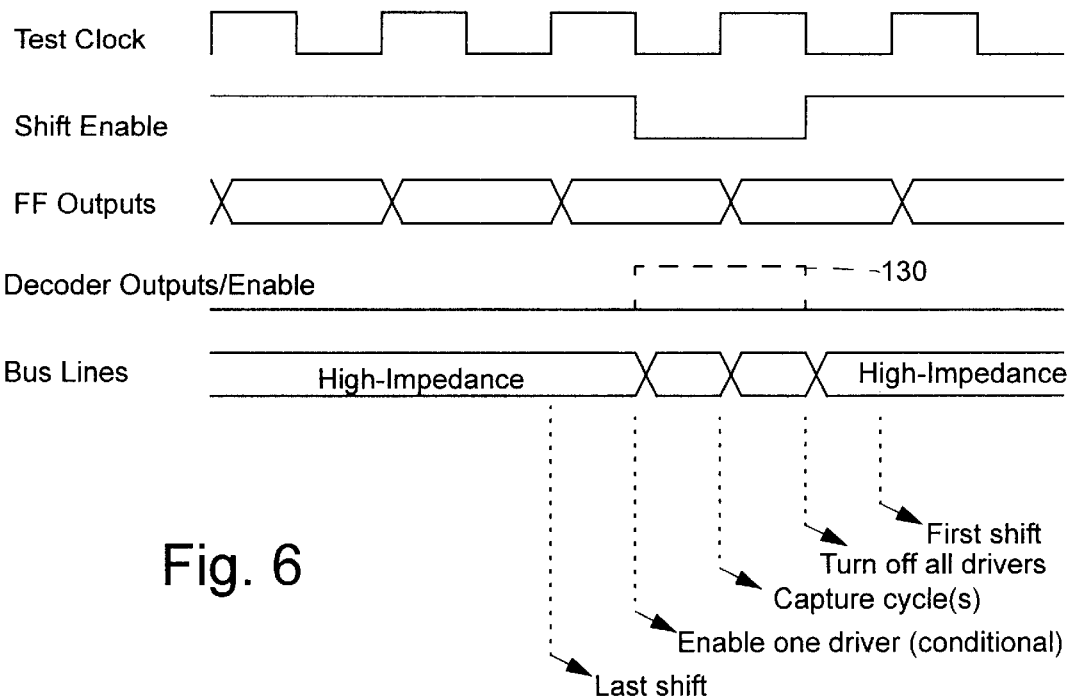
Figure 7:
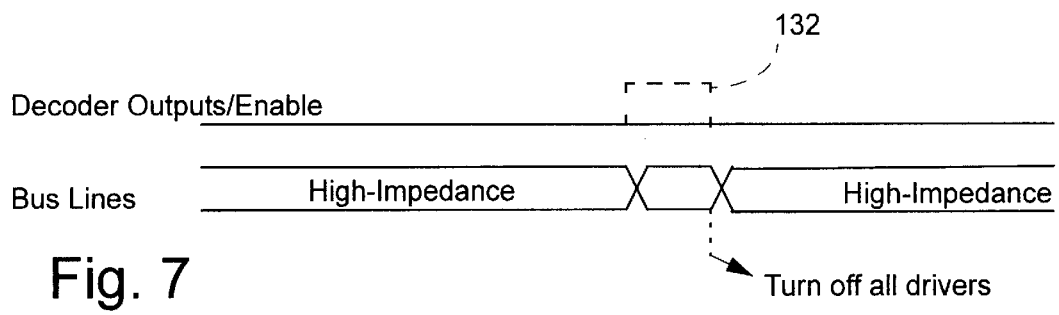
Figure 8:
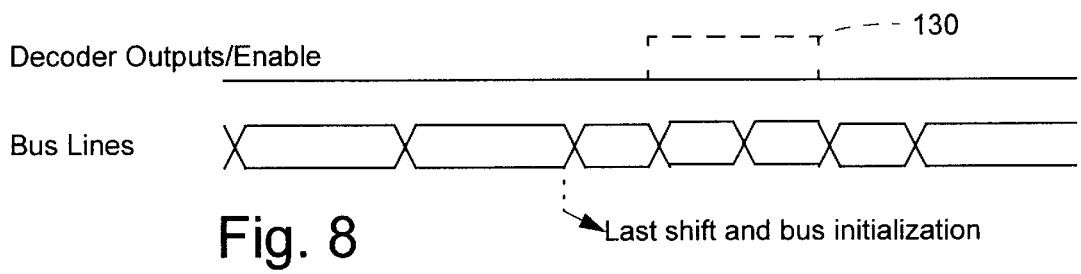
Figure 9:
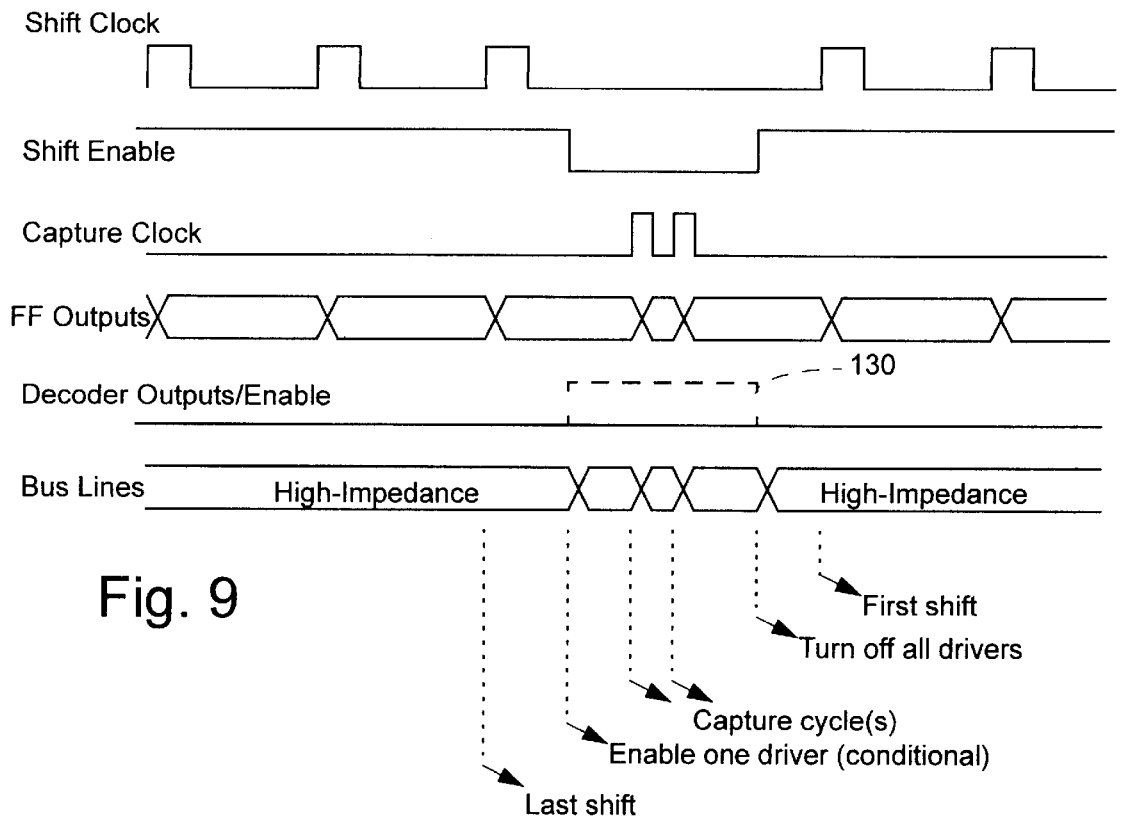
Figure 10:
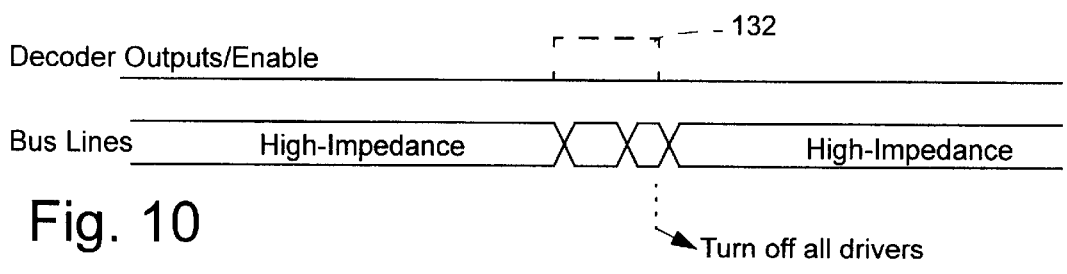
Figure 11:
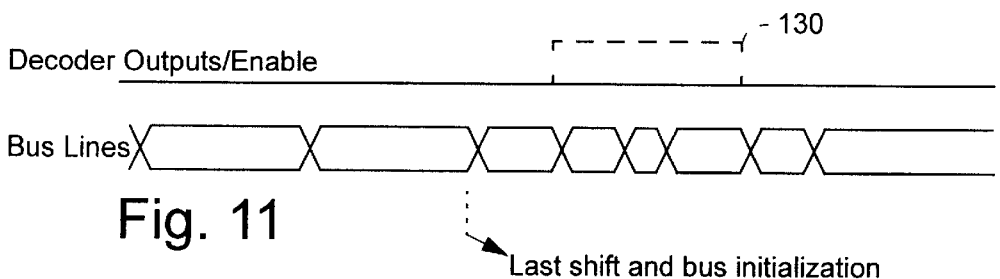

These and other features of the invention will become more apparent from the following description in which reference is made to the appended drawings in which:

FIG. 1 is a schematic diagram which illustrates a portion of an integrated circuit having a bus driver control circuit in accordance with a preferred embodiment of the present invention;

FIG. 2 diagrammatically illustrates a bus driver disabling circuit in accordance with one embodiment of the present invention;

FIG. 3 diagrammatically illustrates a bus driver disabling circuit in accordance with another embodiment of the present invention for use in circuits in which the bus line is heavily loaded;

FIG. 4 diagrammatically illustrates a bus driver disabling circuit in accordance with another embodiment of the present invention for use in circuits in which the bus line is lightly loaded;

FIG. 5 diagrammatically illustrates a bus driver disabling circuit in accordance with another embodiment of the present invention;

FIGS. 6, 7 and 8 illustrate a timing diagram showing the timing of key signals in a method of the present invention when used in a muxed-scan environment; and FIGS. 9, 10 and 11 illustrate a timing diagram showing the timing of key signals in the method of the present invention when used in a clocked scan environment.

DETAILED DESCRIPTION OF PREFERRED EMBODIMENT OF THE INVENTION

FIGS. 1–5 illustrate an integrated circuit and a bus driver control or disabling circuitry according to a preferred embodiment of the present. The circuitry is described first and is followed by a description of preferred and alternative embodiments of the method of the present invention.

FIG. 1 illustrates a portion of an integrated circuit 10. The integrated circuit includes core logic 12, a plurality of scannable memory elements 14 and a test controller 16, also known as a Built-In Self-Test (BIST) controller, which controls test operations. Some integrated circuits may not include a test controller; however, the principles of the present invention may also be used with such circuits. For ease of illustration, the core logic is shown in two parts.

Memory elements 14 are well known in the art and, therefore, are not described in detail. The memory elements shown in FIG. 1 are elements used in a "muxed-scan" environment. Again, to simplify the drawings and facilitate understanding of the invention, multiplexers associated with the memory elements have not been shown. As explained later with reference to the method, the present invention can also be used in other environments, including a "clocked scan" environment.

In general, each memory element is associated with an input to and/or an output from the core logic. The elements can be serially connected to form shift registers or scan chains for loading and coupling test data to the core logic and for unloading the responses of the core logic to the test data from the circuit for analysis.

Each memory element has a clock input 18, a data input D connected to an output of the core logic and/or an output Q connected to an input to the core logic, a serial input SI which is connected to the output Q of another memory element and a scan enable input SE for receiving a shift enable signal which operates to configure the memory elements in a shift mode or in a normal mode. The shift enable signal originates from the test controller 16 and is coupled to all scannable memory elements. The conductors have not been shown to simply the drawings. An active shift enable signal configures the memory elements in shift mode. In this mode, the memory elements are connected in series to define one or more scan chains for shifting a test stimulus into the memory elements and for shifting the responses of the core logic to the test stimulus out of the memory elements. FIG. 1 shows two scan chains. One scan chain 20 originates at the SI1 output of test controller 16 and is connected to the SI input of memory element 22. Scan chain 20 includes memory elements 22, 24, 26, 28, 30 and 32. The Q output of the last memory element 32 in the chain is connected to the SO1 input to test controller 16. The other scan chain 34 includes memory elements 36, 38 and 40 connected in series between output SI2 and input SO2 of test controller 16. An inactive shift enable signal configures the memory elements in normal mode. In this mode, the memory elements are connected to the core logic in normal operational mode for coupling data to and from the core logic. The interval during which the memory elements are configured in normal mode is referred to herein as a "capture interval".

The present invention is concerned with a circuit having two or more tri-state bus drivers. For purposes of illustration, FIG. 1 shows four tri-state bus drivers 50 connected to the core logic. Each driver has a data input 52, an enable input 54 and a data output 56. The data outputs are connected together to form a bus 60 which provides input to the core logic, such as at 62. The core logic provides a data output 64 and a functional enable output 66 for each of the tri-state bus drivers. The circuit may also include an optional auxiliary driver 70. Driver 70 and its connections to the circuit are shown in dotted lines, and is discussed further later. Still further, circuit includes a mechanism such as a pull-up, pull-down or bus holder 72 as discussed later.

The present invention provides a driver control or disabling circuit 80 which is controlled by a TestMode signal and a driver control signal, which is a DecoderEnable signal, both output by test controller 16. TestMode is active during testing operations and inactive during normal operation of the integrated circuit. During normal operation of the integrated circuit (TestMode is inactive), circuit 80 sets all driver select signals to their active value. During test mode (TestMode is active), the DecoderEnable signal is operative to control bus driver select signals. More specifically, when the DecoderEnable signal is inactive, the control circuit disables all of the tri-state drivers 50. The signal is inactive when data is being shifted in or out of the scan chains, i.e., when the shift enable signal is active. When the DecoderEnable signal is active, the control circuit enables at most one of the drivers and disables all other drivers.

Control circuit 80 includes a plurality of scannable memory elements, which in FIG. 1 comprise memory elements 28 and 30, a decoding circuit 82 and a gating circuit 84. Memory elements 28 and 30 serve as storage means for storing a driver select code loaded into the elements during a test data shift-in sequence. Outputs Q of memory elements 28 and 30 are connected to corresponding inputs of decoding circuit 82. Their outputs are also fed back into their respective data inputs D so that the memory elements will hold their respective outputs constant until reset in a test stimulus shift-in sequence. The driver select code identifies which, if any, of the drivers 50 is to be enabled during the next capture interval. These memory elements are similar to those described earlier. Each includes an SE input, an SI input, a data input D and an output Q and form part of scan chain 20, as already mentioned.

Decoding circuit 82 is provided with an enable input 86 for receiving the DecoderEnable signal and an input 88 for receiving the TestMode signal mentioned earlier. Generally, the DecoderEnable signal is the inverse of the shift enable signal. In the illustrated embodiment, the decoding circuit is a 2:4 decoder and, thus receives two inputs and provides four outputs. Two input bits are sufficient to uniquely identify each driver. In general, the decoding circuit is an m:n decoder having m inputs and n outputs, including one output for each bus driver 50. A sufficient number of inputs is provided to enable each driver to be uniquely identified. If the number of bus drivers connected to a bus line is not an integer power of 2, some outputs of the decoder will not be used and some input codes may be used to disable all drivers. The present invention contemplates that unused decoder outputs could be combined with other decoder outputs to ensure that at least one driver is conditionally enabled. An example would be to combine two outputs with an OR gate. Combinations can be such that some drivers are more likely to be enabled than others. This is useful if there is logic in the fanin of these drivers that requires more patterns than the logic in the fanin of the other drivers in order to be tested.

The manner in which the probability of selecting one driver can be altered is as follows. Suppose there are five bus drivers. At least three bits are required to define a code to select the drivers. Three input bits provides eight possible codes (i.e. 000, 001, 010, 011, 100, 101, 110, 111). Since only five codes are required, the designer has a choice as to what to do with the three remaining codes. The designer can decide not to use them so that when these codes are loaded in the memory elements none of the drivers are selected. In this method, it would not be advantageous to do so since, frequently, none of the drivers will be enabled because of the gating with the functional enable signals. A more adequate way of using the extra codes is to associate them with some of the drivers that should be enabled more often because of the amount of logic they allow us to test. The designer can arrange the decoder so that a first driver is selected (i.e. driver_select_1 signal=1) if codes 000 and 001 are provided, a second driver is selected (driver_select_2 signal=1) if code 010 is provided, a third driver is selected (driver_select_3 signal=1) if code 011 is provided, a fourth driver is selected (driver_select_4 signal=1) if code 100 is provided, and a fifth driver is selected (driver_select_5 signal=1) if codes 101, 110 and 111 are provided. This is only one of the many possible code assignments. A person skilled would know how to build such simple decoders.

In FIG. 1, gating circuit 84 includes an AND gate 90 associated with each tri-state driver 50. Each AND gate has a first input 92 for receiving a functional enable signal output by the core logic and a second input 94 for receiving a driver select output 96 from the decoding circuit for its associated driver and has an output connected to the enable input 54 of its associated driver 50. When both inputs to an AND gate are active, the output of the AND gate will be active, thus enabling the driver associated with the AND gate. If either input to the AND gate is inactive, the associated driver is disabled.

In conventional testing methods, an active shift enable signal is applied to the shift enable input SE of all of the memory elements. This causes the memory elements to be configured in scan mode. A test stimulus is then clocked into the memory elements in each scan chain. When all of the test stimulus bits have been loaded into the scan chains, the shift enable signal is de-activated. This configures the memory elements in normal mode and initiating the capture interval during which at least one active clock edge is applied to capture the response of the core logic to the test stimulus by the memory elements. The shift enable signal is re-activated to, once again, configure the memory elements in scan mode and then the captured data is clocked out of the memory elements for examination.

FIG. 2 schematically illustrates disabling circuit which is employed to disable the driver testing circuitry during normal operation of the integrated circuit.

Since the driver control/disabling circuitry is not required during normal operation of the integrated circuit, it is desirable to provide a mechanism for reducing the impact of the bus driver on the propagation delay in cases where fast propagation delays are required. FIGS. 3 and 4 illustrate two specific implementations of a disabling circuitry which achieve this objective. The circuit of FIG. 3 is particularly useful when the bus line is heavily loaded whereas the circuit of FIG. 4 is useful for a lightly loaded bus line. The only variation with respect to prior art circuitry is that two signals, instead of one, operate to enable/disable the driver. The design can be arranged to minimize the delays through the functional inputs (EN and Data). The delay through test-dedicated input $\overline{DIS}$ (the driver select signal) is not as important.

FIG. 3 illustrates a bus driver 50 comprised of a p-channel transistor 100 and an n-channel transistor 102 and a disabling circuit 104 including an inverter 106 which receives data to be applied to the gate of the transistors, a first AND gate 108 which receives the output of the inverter, the functional enable output of the core logic and the select signal from the decoding circuit. A second AND gate 110 receives the output of the inverter, the functional enable output of the core logic and the inverted select signal from the decoding circuit. FIG. 4 illustrates an alternative bus driver 112 comprised of three p-channel transistors 114 and three n-channel transistors 116. FIG. 5 illustrates another alternative bus driver 120 comprised of a pair of serially connected transistors 122 and 124 which receive an output from the decoder circuit and a functional enable output from the core logic.

It is to be noted that the circuits illustrated in FIGS. 2 to 5 are functionally equivalent. Different circuits are required to accommodate different requirements of size and speed. For example, the circuit of FIG. 5 is used to build what is called a tri-state multiplexor or tri-state MUX. In this case, the output bus is usually lightly loaded and also very short because the different drivers are close physically close to each other. All these implementations are only examples. Another variation is to have enable signals that enable the bus driver when low instead of high.

As mentioned earlier, the memory elements illustrated in FIG. 1 are used in a muxed-scan environment. The memory elements used in a "clocked-scan" embodiment are different, as well known in the art, but essentially the same methods can be used to control the drivers as will be seen. In clocked scan, the scan enable input of the memory element is replaced by a shift clock input. Clock pulses are applied to a scan clock input-to transfer data from the SI input to the Q output. During this time, the memory element clock input must be inactive. In order to transfer data from the D input to the Q output, clock pulses must be applied to the clock input while the shift clock is inactive.

The method of the present invention involves disabling all drivers during scan intervals and enabling at most a selected one of the drivers during the capture interval by generating a driver select signal for each driver and gating the driver select signal with the circuit functional enable signal for each driver to generate a driver enable signal. The driver select signals are generated in such a manner that at most only the selected one of the drivers is active during the capture sequence. The selected one of the drivers is selected by loading a driver select code into memory elements during the scan-in sequence and decoding the driver select code to produce the driver select signals. The driver select codes are active only during the capture interval. The present invention provides three embodiments of a method of testing the circuit thus far outlined. In view of the similarity between the shift enable and DecoderEnable signals, in that, in some embodiments, the latter is the inverse of the former, it will be understood that the decoder can be controlled by the shift enable signal operating through an inverter.

FIGS. 6–8 illustrate the timing of various signals in accordance with a first embodiment of the method of the present invention as it relates to the muxed scan environment illustrated in FIG. 1. In this environment, the memory elements have only one clock input and two data inputs as is also the case in clocked-scan memory elements. The Test Clock signal shown in FIG. 6 is applied to the clock input of the memory elements. The shift enable signal is applied to the SE input of the memory elements and operates to select which of the two data inputs is being loaded into the memory elements. The "FF Outputs" waveform is the output of all scannable memory elements and will be either active or inactive depending on the data loaded into them during the shift-in sequence.

The "decoder outputs/enable" waveform shows the state of all of the outputs of the decoder, and also represents the behaviour of the decoder enable input. Generally, the decoder outputs are inactive throughout the shift-in, capture and shift-out operations except for the output associated with at most one of the drivers which may be active. That output is indicated by dotted line 130. In a first embodiment of the method, the duration of that state is the same as that of the capture interval. During this interval, the core logic may activate and de-activate its functional enable output associated with the selected driver several times, but the associated output of the decoder remains fixed throughout the interval. The "Bus Lines" waveform illustrates the state of the bus 60.

In accordance with a first embodiment of the method of the present invention, driver select codes are loaded into scannable memory elements 28 and 30 during the shift-in sequence. The outputs of the memory elements are decoded by the 2:4 decoder and driver select signals are generated and coupled to the gating circuits associated with each of the drivers 50. At most, one of the drivers will receive an active driver select signal. The remaining drivers receive an inactive driver select signal. The driver select signals are gated with a functional enable signal output from the core logic for each driver. When both the functional enable signal and driver select signal are active, the associated driver is enabled causing the associated data output by the core logic to be output by the selected or enabled driver. Otherwise, the driver is disabled. As shown in FIG. 6, at the end of the capture interval, indicated by the shift enable signal become active, all drivers are disabled or turned OFF.

A second embodiment of the method, shown in FIG. 7, is similar to that of FIG. 6, except that, rather than disabling the selected drivers at the end of the capture interval when the shift-enable signal is re-activated, the selected driver is disabled consequent to the last active edge of the capture clock. This is achieved by the test controller de-activating the DecoderEnable signal essentially concurrently with the last active edge of the capture cycle. The "Decoder Outputs/Enable" waveform shows that the duration of the active portion, shown by dotted line 132, of decoder output is shorter than that of its counterparts in FIGS. 6 and 8. The period of time during which the selected driver is enabled is reduced. The decoder outputs are controlled by the DecoderEnable signal so as to disable all drivers in the vicinity of the last capture clock edge. In this way, the data captured by the memory elements during the last capture clock cycle does not propagate to the bus drivers. This is preferred when a bus holder is used on a bus line. Otherwise, the values captured during the first capture clock cycle of the next scan pattern can be erroneously predicted by circuit analysis software used to predict the behaviour of the circuit. This would happen if the value memorized by bus holder 72 propagated to any memory element.

A third embodiment of the method, shown in FIG. 8, involves the use of auxiliary driver 70. It will be seen from FIG. 1 that the DecoderEnable signal is coupled to the enable input of auxiliary driver 70. When the auxiliary driver is enabled, all bus drivers 50 are de-activated, achieved by asserting an inactive value on the decoder enable signal. A pre-defined driver value for the auxiliary driver is loaded into its associated scannable memory element 32 during the scan-in sequence. The output of memory element 32 is coupled to the data input of the auxiliary driver whose output is connected to bus 80. The decoder outputs are controlled in the same manner as in the first embodiment. However, the auxiliary driver 70 is used to initialize the bus holder to a value that depends on the scan pattern just scanned in. The auxiliary driver must be turned OFF before, or around the same time, any of the other bus drivers are enabled to drive the bus line.

The path from the memory elements 28 and 30, which provide the input code to the decoder, to the bus drivers might be critical if the bus drivers are distributed throughout the chip. If the delay in this path is significant with respect to the clock period of the test clock, the method described by Nadeau-Dostie et al U.S. application Ser. No. 08/752,499 filed Nov. 20, 1996 for "Method And Apparatus For Scan Testing Digital Circuits", incorporated herein by reference, can be used to resolve this issue by considering memory elements 28 and 30 to be sources of multi-cycle paths. The effective frequency of these memory elements will cause the last shift event to occur much earlier, providing enough time for the decoder outputs to propagate to their respective bus drivers. The shift enable signal corresponding to the effective frequency selected should be used to gate the decoder outputs. The functional paths are still exercised at their operating speed.

FIGS. 9–11 illustrate the timing of a circuit in a clocked scan design environment. In this environment, each memory element has two clock inputs and two data inputs. As previously mentioned, in clocked scan, the scan enable input of the memory element is replaced by a shift clock input. Clock pulses are applied to a scan clock input to transfer data from the SI input to the Q output. During this time, the memory element clock input is inactive. In order to transfer data from the D input to the Q output, clock pulses are applied to the clock input while the shift clock is inactive.

Assume that the memory elements load data on the rising edge of either clock and that both clocks cannot be active at the same time. The shift clock causes test patterns to be loaded serially into the scan chains using the scan-in input SI of the memory elements. An active (value of 1) shift enable signal indicates that a pattern is currently being loaded. The capture clock causes the elements to capture the response of the circuit to the test pattern that was shifted-in. One or more capture clock pulses can be applied during the capture interval.

The shift enable signal is active throughout the shift-in and shift-out sequences and de-activated consequent to the last cycle of the test data shift-in sequence shown on the left side of the shift clock waveform. The shift clock is disabled when the shift enable is inactive. The DecoderEnable waveform is generally the inverse of the shift enable waveform. A capture interval occurs during the inactive state of the shift enable signal.

The Figure also shows a capture clock which may have a different clock rate from that of the shift clock. The "FF Outputs" waveform shows the states and timing of the output of all scannable memory elements. The "Decoder Outputs/Enable" waveform shows the state of the outputs of the decoder, and also represents the behaviour of the decoder enable input. Dotted line 130 shows the state of the output of the selected driver, if any.

During the capture interval, at most one bus driver is allowed to drive each bus line, as determined by the decoder. As in the previous embodiments, the bus driver selected to drive the bus is the same throughout the capture interval, irrespective of the number of capture clock cycles. The selected driver can be turned ON and OFF during the capture interval, according to the function implemented by the core logic of the circuit under test. As in the muxed-scan environment, three slightly different embodiments of the method are provided to control the bus drivers.

According to the first method mentioned earlier, an inactive value of the DecoderEnable signal during the shift-in and shift-out operations operates to disable all drivers by forcing the decoder outputs to their inactive value (0) and, at most, one driver is enabled throughout the capture interval.

In the second method, shown in FIG. 10, the period of time during which the selected driver is enabled is reduced. The decoder outputs are controlled by the DecoderEnable signal so as to disable all drivers in the vicinity of the last capture clock edge. In this way, the data captured by the memory elements during the last capture clock cycle does not propagate to the bus drivers. This is preferred when a bus holder is used on a bus line. Otherwise, the values captured during the first capture clock cycle of the next scan pattern can be erroneously predicted by circuit analysis software used to predict the behaviour of the circuit. This would happen if the value memorized by bus holder 72 propagated to any memory element.

The third embodiment of the method, shown in FIG. 11, is another way to overcome the same issue. In this embodiment, the decoder outputs are controlled in the same manner as in the first embodiment. However, the auxiliary driver 70 is used to initialize the bus holder to a value that depends on the scan pattern just scanned in. The auxiliary driver must be turned OFF before, or around the same time, any of the other bus drivers are enabled to drive the bus line. The invention can be used in other scan environments such as Level-Sensitive Scan Design (LSSD), with timing is similar to the clocked scan environment.

It was indicated earlier that pull-up and pull-down devices could also be used to provide a known value on the bus line when all drivers are in a high impedance state. A pull-up pulls the bus line to the positive supply voltage VDD which represents a value of 1. A pull-down pulls the bus line to the negative supply voltage VSS which represents a value of 0. Pull-ups and pull-downs are usually slow and cannot always pull the bus line within one clock cycle. This means that the value on the bus line can be undefined for a while. The test method employed either must ensure that the undefined value does not propagate to a memory element or that a mechanism is provided to mask out the undefined value before it reaches the signature analyzer of a Built-In Self-Test (BIST) circuit. Bus holders are generally preferred over pull-ups and pull-downs because they can pre-charge the bus to 0 and 1 and provide higher fault coverage of the bus drivers, the value on the bus line is always defined so that no undefined value can propagate to memory elements, and they allow testing for excessive quiescent current (Iddq). Bus holders are particularly preferred when multiple capture clock cycles are used and the clock period is short. Pull-ups and pull-downs might not have time to impose a known value on the bus line during this period. The unknown value on the bus line would need to be prevented from propagating to any memory element. However, pull-ups and pull-downs do offer some advantages in the implementation of circuit analysis tools and, accordingly, are considered as well.

It will be understood that various modifications and alterations may be made to the disabling circuitry and methods of the present invention without departing from the spirit of the invention as defined by the appended claims.

I claim:

1. In a method of testing a circuit having two or more tri-state bus drivers, each having a data input, an enable input and a data output, said data outputs being connected together to form a bus, said circuit having core logic, a plurality of scannable memory elements, each having a clock input, an input connected to the output of the core logic and/or an output connected to an input to said core logic, and being configurable in scan mode in which said memory elements are connected to define one or more scan chains and in normal mode in which said memory elements are connected to said core logic in normal operational mode, said core logic generating a data input and a functional enable signal for each said tri-state bus drivers, said bus providing input to said core logic, said method including a shift-in sequence for clocking a test stimulus into said memory elements, a capture operation for capturing the response of the core logic to the test stimulus and a shift-out sequence for clocking captured responses out of said elements for analysis, said method comprising the improvement of:

storing a driver select code signal in scannable memory elements associated with said bus drivers, said driver select code signal identifying at most only one of said driver which is to be active during normal mode;

decoding the output of said associated scannable memory elements and generating a decoded driver select signal for each of said bus drivers;

gating each said decoded driver select signal with a functional driver enable signal for each said driver to generate a driver enable signal and applying said driver enable signal to said enable input of said driver;

disabling all of said drivers by generating an inactive driver select signal for each said bus drivers when said plurality of memory elements are configured in scan mode; and applying said driver enable signal to each said bus drivers when said plurality of memory elements are configured in normal mode.

2. A method as defined in claim 1, further including the step of imposing a pre-defined value on said bus when said drivers are disabled.

3. A method as defined in claim 2, wherein said step of imposing is performed by a bus holder.

4. A method as defined in claim 2, wherein the step of imposing a pre-defined value to the bus when said selected driver is disabled is performed using a pull-up or a pull-down.

5. A method as defined in claim 2, further including performing a capture operation when said plurality of memory elements are configured in normal mode, said step of performing a capture operation including applying one or more capture clock edges to said memory elements.

6. A method as defined in claim 5, wherein the step of disabling said tri-state bus drivers is performed around the time of or just prior to the last active capture clock edge.

7. A method as defined in claim 6, wherein said disabling step including storing a value driven into the bus consequent to a penultimate capture clock edge when a capture operation comprises more than one clock edge and otherwise storing a value driven onto the bus consequent to the last clock edge of a shift operation prior to a capture operation, and using said stored value in a subsequent test stimulus loading sequence if all drivers are disabled when performing a following capture operation.

8. A method as defined in claim 5, wherein the step of disabling said tri-state bus drivers including enabling an auxiliary bus driver and driving-onto said bus a value received from a scannable memory element associated with said auxiliary bus driver.

9. A method as defined in claim 1, where the step of generating driver select signals is performed in a way that said select signals have the same probability of being active.

10. A method as defined in claim 1, wherein said generating driver select-signals including generating signals in a manner which increases the probability of one or more specific driver being selected.

11. A method as defined in claim 10, wherein said manner which increases the probability including combining unused decoder outputs to increase the probability of one or more specific driver being selected.

12. A method of testing a circuit having two or more tri-state bus drivers, said drivers having a data input, an enable input and a data output, said data outputs being connected together to form a bus, said circuit having core logic, a plurality of scannable memory elements, each having a clock input, an input connected to the output of the core logic and/or an output connected to an input to said core logic, and configurable in scan mode in which said memory elements are connected to define one or more scan chains and in normal mode in which said memory elements are connected to said core logic in normal operational mode, said core logic generating data input and a functional enable signal for said tri-state bus drivers, said bus providing input to said core logic, said method comprising the steps of:

configuring said memory elements in scan mode;

disabling all of said tri-state bus drivers;

shifting a test stimulus and a driver select code into all scannable memory elements, said driver select code identifying at most a selected one of the said drivers which is to be active during said normal mode;

decoding the output of scannable memory elements which store said driver select code and generating a driver select signal for each said bus driver, including an active driver select signal for said one of said drivers and an inactive driver select signal for the balance of said drivers;

gating each said driver select signal with a functional enable signal associated with said driver to generate driver enable signal therefor;

driving said bus with a data input value of said one of said drivers selected when said driver is enabled or imposing a pre-defined value onto said bus when said selected driver is disabled;

configuring said scannable memory elements in normal mode;

performing a capture operation;

configuring said scannable memory elements in scan mode;

disabling said tri-state bus drivers, shifting out the output response of the circuit; and analysing the output response of the circuit.

13. A method as defined in claim 12, further including generating a driver control signal, disabling all of said drivers when said driver control signal is inactive and enabling at most one of said drivers when said driver control signal is active.

14. A method as defined in claim 13, said driver control signal being an inverse of a shift enable signal.

15. A method as defined in claim 12, wherein the step of imposing a pre-defined value onto said bus when said selected driver is disabled is performed using a bus holder.

16. A method as defined in claim 12, wherein the step of imposing a pre-defined value onto said bus when said selected driver is disabled is performed using a pull-up or a pull-down.

17. A method as defined in claim 15, wherein the step of performing a capture operation consists in applying one or more capture clock cycles to said memory elements.

18. A method as defined in claim 17, wherein the step of disabling said tri-state bus drivers is performed around the time of or just prior to the last active capture clock edge.

19. A method as defined in claim 17, wherein said step of disabling said tri-state bus drivers including enabling an optional bus driver, and driving the value received from a scannable memory element on said bus.

20. A method as defined in claim 12, wherein said generating driver select signals including generating signals in a manner which increases the probability of one or more specific driver being selected.

21. A method as defined in claim 20, wherein said manner which increases the probability including combining unused decoder outputs to increase the probability of one or more specific driver being selected.

22. A method as defined in claim 12, wherein the step of generating driver select signals including combining unused decoder outputs to increase the probability of a specific driver select signals being active.

23. A driver control circuit for use in an integrated circuit having core logic two or more tri-state bus drivers, each having a data input, an enable input and a data output, said data outputs being connected together to form a bus, said circuit having core logic, a plurality of scannable memory elements, each having a clock input, an input connected to the output of the core logic and/or an output connected to an input to said core logic, and being configurable in scan mode in which said memory elements are connected to define one or more scan chains and in normal mode in which said memory elements are connected to said core logic in normal operational mode, said core logic generating a data input and a functional enable signal for each said tri-state bus drivers, said bus providing input to said core logic, the improvement comprising:

storage means associated with said bus drivers for storing a driver select code signal identifying at most only one of said drivers which is to be active during normal mode;

decoding means for decoding said driver select code signal and generating a decoded driver select signal for each of said bus drivers;

gating means for gating each said decoded driver select signal with a functional driver enable signal for each said driver and generating a driver enable signal and applying said driver enable signal to said enable input of said driver;

said decoding means being responsive to an active driver control signal for disabling all of said drivers by generating an inactive driver select signal for each said bus drivers when said plurality of memory elements are configured in scan mode; and being responsive to an inactive scan signal by applying said driver enable signal to each said bus drivers when said plurality of memory elements are configured in normal mode.

24. An integrated circuit as defined in claim 23, said storage means comprising scannable memory elements associated with said drivers.

25. An integrated circuit as defined in claim 23, further including disabling means for disabling said control circuit during normal operation of said integrated circuit.

26. An integrated circuit as defined in claim 23, further including an auxiliary tri-state bus driver having a data input, an enable input for receiving said driver control signal, and a data output connected to said bus, second storage means connected to said auxiliary bus driver data input for storing input data for auxiliary driver.

27. An integrated circuit as defined in claim 23, further including means for imposing a pre-defined value on said bus when all drivers are in a high-impedance state.

28. An integrated circuit as defined in claim 27, said means for imposing. comprising one of a bus holder, a pull-up or a pull-own.

29. An integrated circuit as defined in claim 23, said decoding means comprising an m:n decoder wherein m is the number of inputs to said decoder and n is the number of outputs from said decoder and said storage means comprises a number of scannable memory elements corresponding to m.

30. A driver control circuit for use in an integrated circuit having core logic two or more tri-state bus drivers, each having a data input, an enable input and a data output, said data outputs being connected together to form a bus, said circuit having core logic, a plurality of scannable memory elements, each having a clock input, an input connected to the output of the core logic and/or an output connected to an input to said core logic, and being configurable in scan mode in which said memory elements are connected to define one or more scan chains and in normal mode in which said memory elements are connected to said core logic in normal operational mode, said core logic generating a data input and a functional enable signal for each said tri-state bus drivers, said bus providing input to said core logic, the improvement comprising:

first storage means associated with said bus drivers for storing a driver select code signal identifying at most only one of said drivers which is to be active during normal mode, said storage means comprising a scannable memory element associated with each said driver;

decoding means for decoding said driver select code signal and generating a decoded driver select signal for each of said bus drivers;

gating means for gating each said decoded driver select signal with a functional driver enable signal for each said driver and generating a driver enable signal and applying said driver enable signal to said enable input of said driver, said gating means comprising a two input AND gate associated with each said driver;

means for imposing a pre-defined value on said bus when all drivers are in a high-impedance state;

an auxiliary tri-state bus driver having a data input, an enable input for receiving said driver control signal, and a data output connected to said bus, second storage means connected to said auxiliary bus driver data input for storing input data for auxiliary driver;

said decoding means being responsive to an active driver control signal for disabling all of said drivers by generating an inactive driver select signal for each said bus drivers when said plurality of memory elements are configured in scan mode; and being responsive to an inactive scan signal by applying said driver enable signal to each said bus drivers when said plurality of memory elements are configured in normal mode.

\* \* \* \* \*